United States Patent [19]
Asano

[11] Patent Number: 5,837,570
[45] Date of Patent: Nov. 17, 1998

[54] HETEROSTRUCTURE SEMICONDUCTOR DEVICE AND METHOD OF FABRICATING SAME

[75] Inventor: Tetsuro Asano, Ora-Gun, Japan

[73] Assignee: Sanyo Electric Co., Ltd., Osaka, Japan

[21] Appl. No.: 773,347

[22] Filed: Dec. 26, 1996

[30] Foreign Application Priority Data

Dec. 28, 1995 [JP] Japan ................................. 7-343398
Dec. 28, 1995 [JP] Japan ................................. 7-343400
Dec. 28, 1995 [JP] Japan ................................. 7-343401
Dec. 28, 1995 [JP] Japan ................................. 7-343402

[51] Int. Cl.$^6$ ............................................. H01L 21/338
[52] U.S. Cl. ........................... 438/172; 257/192; 257/193
[58] Field of Search ........................... 438/172; 257/192, 257/193

[56] References Cited

U.S. PATENT DOCUMENTS

| 5,324,682 | 6/1994 | Tserng ........................................ 437/54 |
| 5,488,237 | 1/1996 | Kuwata ..................................... 257/194 |
| 5,681,766 | 10/1997 | Tserng et al. ............................. 437/34 |
| 5,686,740 | 11/1997 | Hida ........................................... 257/192 |
| 5,698,888 | 12/1997 | Fukaishi ................................... 257/420 |

OTHER PUBLICATIONS

IEEE Electron Device Letters, vol. 15, No. 9, Sep. 1994, pp. 324–326 by Jong–Lam Lee et al.

*Primary Examiner*—John Niebling
*Assistant Examiner*—Michael S. Lebentritt
*Attorney, Agent, or Firm*—Armstrong, Westerman, Hattori, McLeland & Naughton

[57] ABSTRACT

A heterostructure semiconductor device such as a GaAs MESFET has an n-type GaAs layer disposed as a channel region in a substrate, a gate electrode disposed on the n-type GaAs layer in direct contact therewith, source and drain electrodes disposed on the n-type GaAs layer, and a GaInP layer disposed as a passivation layer on the n-type GaAs layer in lattice alignment therewith between the gate electrode and the source and drain electrodes.

4 Claims, 16 Drawing Sheets

F I G. 1 0
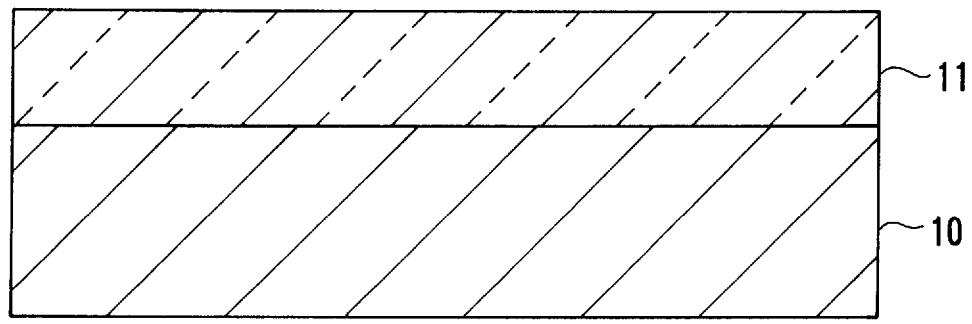

F I G. 1 1
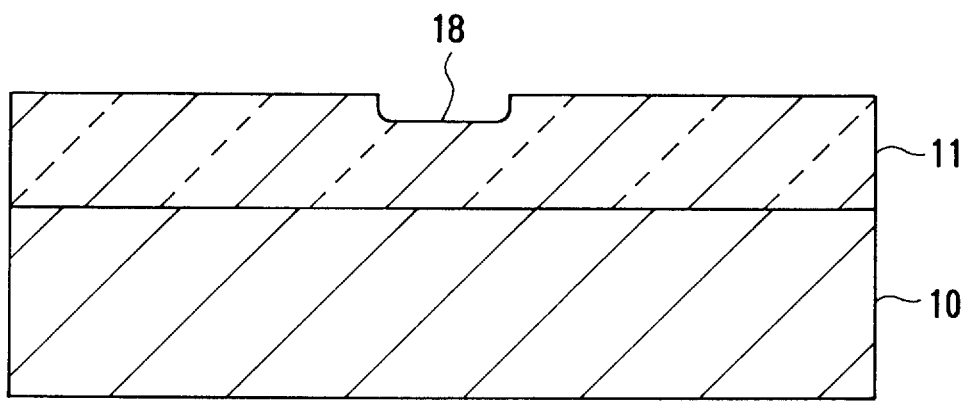
F I G. 1 2
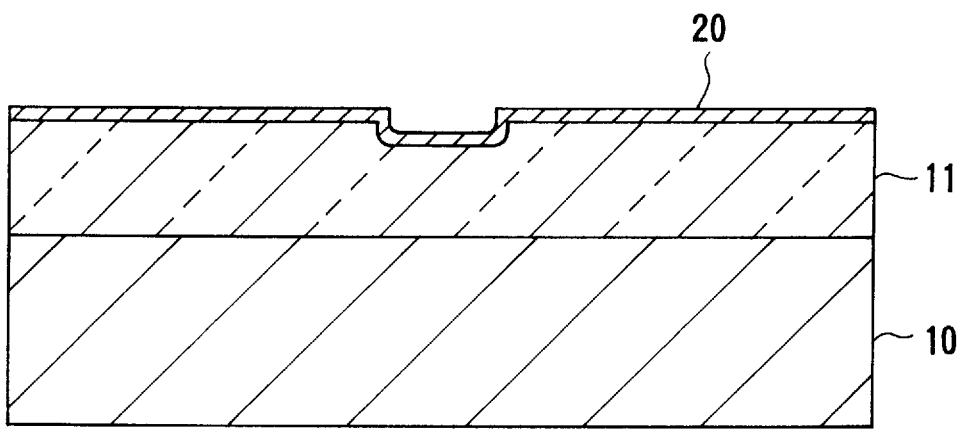

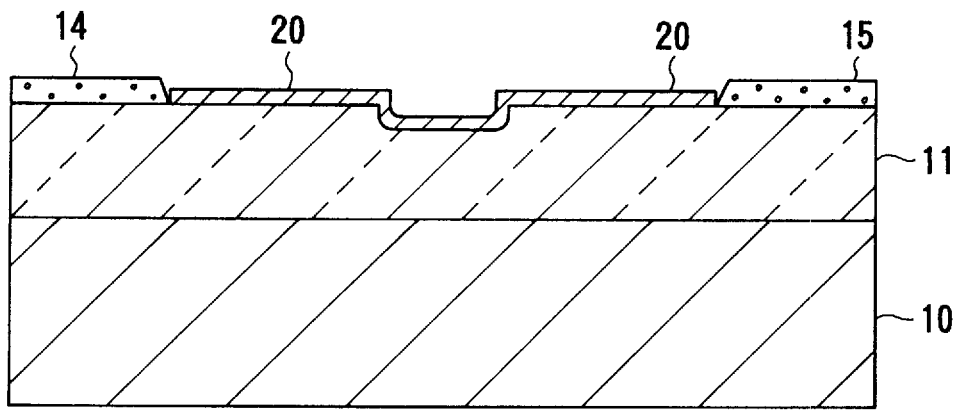
F I G. 13
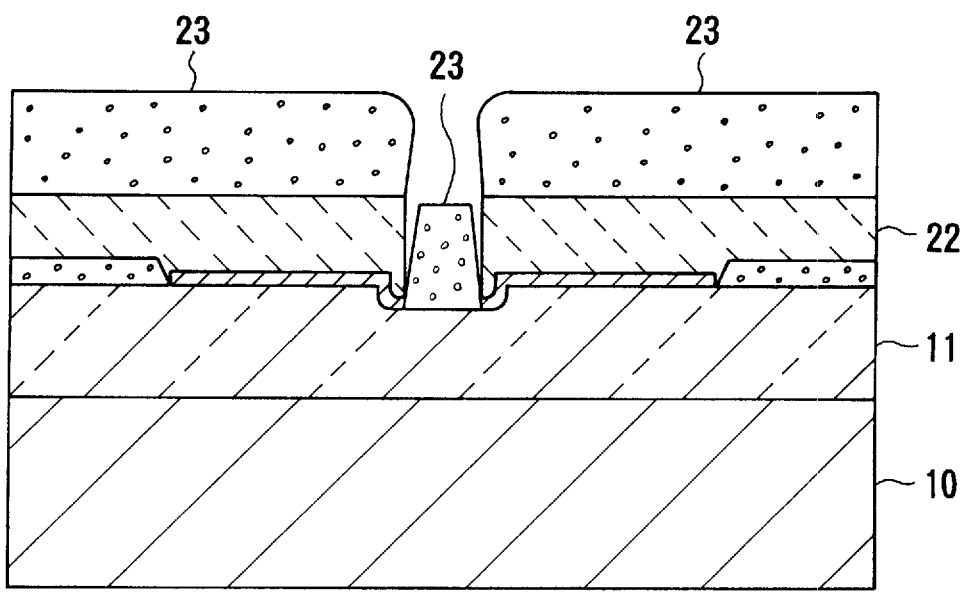
F I G. 14

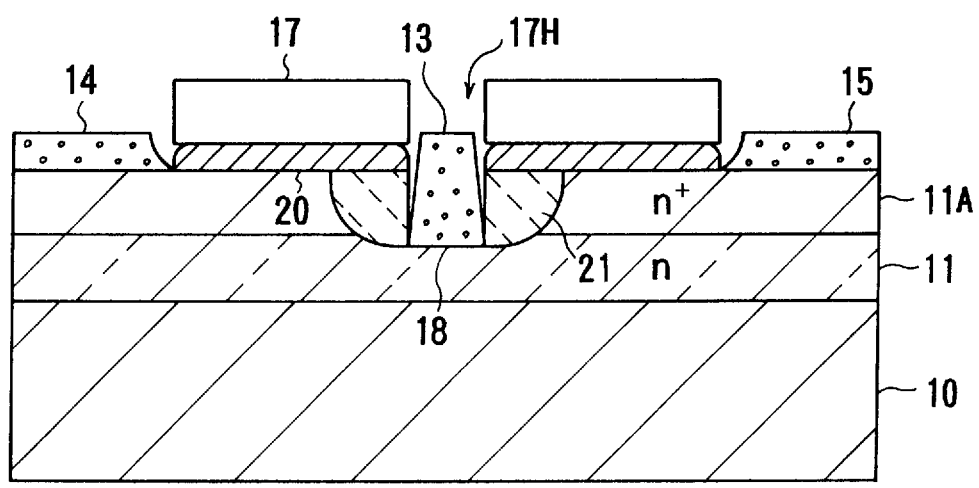
F I G. 16

F I G. 19
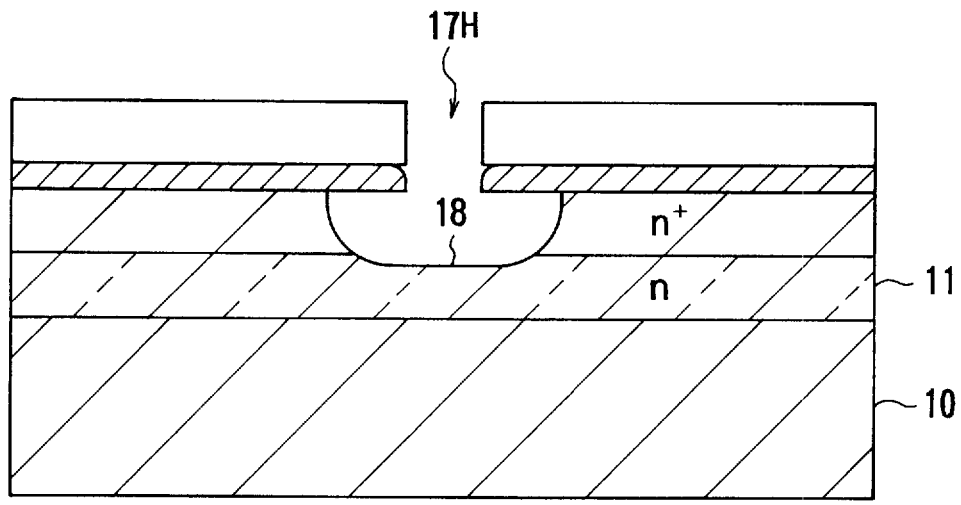
F I G. 20
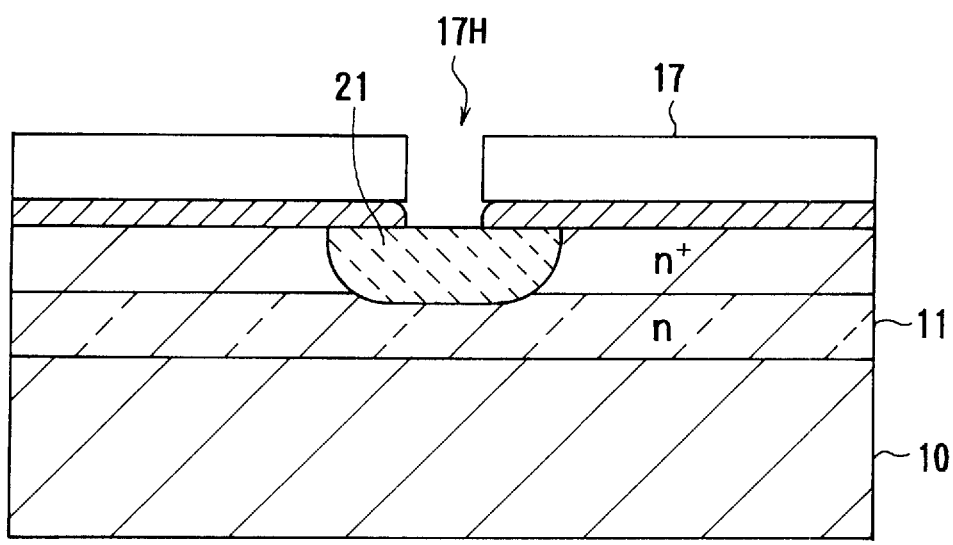

HETEROSTRUCTURE SEMICONDUCTOR DEVICE AND METHOD OF FABRICATING SAME

BACKGROUND OF THE INVENTION

1. Field of the Invention

The present invention relates to a heterostructure semiconductor device and a method of fabricating such a heterostructure semiconductor device, and more particularly to the structure of a passivation layer in a heterostructure semiconductor device such as a GaAs MESFET (Metal Semiconductor Field Effect Transistor), a GaAs HEMT (High Electron Mobility Transistor), etc.

2. Description of the Prior Art

Heterostructure semiconductor devices including GaAs MESFETs, GaAs HEMTs, etc. are suitable for use as ultrahigh-speed devices and ultrahigh-frequency devices because of their high electron mobility, and are finding wide use in portable telephone applications in recent years. However, such GaAs devices are more difficult to passivate for surface protection than silicon devices. If GaAs devices are used as oscillating devices, then they should be improved for lower phase noise. If GaAs devices are used as high-output power devices, then they should be improved for higher output, higher gain, higher efficiency, and more linearity.

FIG. 24A of the accompanying drawings shows a conventional GaAs power MESFET. The structure of the illustrated GaAs power MESFET is described in an article entitled "2.9V Operation GaAs Power MESFET" (IEEE ELECTRON DEVICE LETTERS, VOL. 15, No. 9, September 1994). The GaAs power MESFET has an n-type GaAs layer 11 serving as a channel region and disposed over a GaAs substrate 10. The n-type GaAs layer 11 is insulated and separated from the GaAs substrate 10 by an undoped layer 10A as a buffer layer. The GaAs power MESFET also includes a source electrode 14 and a drain electrode 15 which are spaced from each other and disposed on the n-type GaAs layer 11. An undoped GaAs layer 16 for passivating a surface of layer 11 is disposed between the source electrode 14 and the drain electrode 15 and on the n-type GaAs layer 11. The undoped GaAs layer 16 is etched to define a recess 12 therein, and a gate electrode 13 is positioned in the recess 12 and formed in direct contact with the n-type GaAs layer 11, providing a Schottky junction therebetween. The recess 12 is etched for the purposes of exposing the n-type GaAs layer 11, adjusting the resistance between the source electrode 14 and the drain electrode 15, and increasing the breakdown voltage between the source electrode 14 and the drain electrode 15.

The undoped GaAs layer 16 which is disposed between the source electrode 14 and the drain electrode 15 and on the n-type GaAs layer 11 is formed as a passivation film for surface protection. If no passivation film were present on the n-type GaAs layer 11, many surface states would be developed, resulting in the formation of a thick natural depletion layer. The thick natural depletion layer would constrict a channel, causing less carriers to be present and a smaller current to flow. The constricted channel would prevent GaAs devices from having higher output capabilities and higher efficiencies, and lower the linear input/output relationship thereof. The surface states would be responsible for large phase noise in GaAs devices as oscillating devices. To avoid the above drawbacks, it has heretofore been customary to form the undoped GaAs layer 16 as a passivation layer continuously on the n-type GaAs layer 11 by way of epitaxial growth. The undoped GaAs layer 16 is capable of preventing a formation of a thick natural depletion layer due to many surface states. The undoped GaAs layer 16 electrically serves as an insulator.

While the undoped GaAs layer 16 formed as a passivation layer on the n-type GaAs layer 11 is effective in reducing surface states, difficulty has been experienced in forming the undoped GaAs layer 16. Since the undoped GaAs layer 16 as a passivation layer and the n-type GaAs layer 11 as the channel region are of the same material, it is not possible to selectively etch the undoped GaAs layer 16 only. Therefore, when the gate electrode 13 is formed or when the source, and drain electrodes 14, 15 are formed, it is difficult to control the depth to which the undoped GaAs layer 16 and the n-type GaAs layer 11 are etched. As a consequence, the reproducibility of the etched structure of the undoped GaAs layer 16 and the n-type GaAs layer 11 has been poor.

More specifically, when the undoped GaAs layer 16 is etched to expose the n-type GaAs layer 11 lying underneath the undoped GaAs layer 16, the undoped GaAs layer 16 tends to be overetched or underetched. If the undoped GaAs layer 16 is overetched, then a source-to-drain current $I_{DDS}$ is reduced. If the undoped GaAs layer 16 is underetched leaving a thickness of it on the n-type GaAs layer 11, then the remaining surface of the undoped GaAs layer 16 and the subsequently formed gate electrode 13 jointly make up a Schottky junction, resulting in as much a reduction in the source-to-drain conductance gm as the remaining thickness of the undoped GaAs layer 16. Also, when the source and drain electrodes 14, 15 are formed or the remaining thickness of the undoped GaAs layer 16, the ohmic resistance between electrode and n-type GaAs layer 11 is increased, making various properties poorer. Inasmuch as the undoped GaAs layer 16 and the n-type GaAs layer 11 are of the same material, as described above, it is difficult to detect the end of the etching process, and also to achieve a desired level of the reproducibility of the etched structure.

FIG. 24B of the accompanying drawings illustrates another conventional heterostructure semiconductor device. As shown in FIG. 24B, the conventional heterostructure semiconductor device has an n-type GaAs layer 11 disposed on a semi-insulating GaAs substrate 10, source and drain electrodes 14, 15 disposed on the n-type GaAs layer 11, a passivation layer 20 disposed on the n-type GaAs layer 11 between the source and drain electrodes 14, 15, and a gate electrode 13 disposed in an etched recess 18 in the passivation layer 20 and the n-type GaAs layer 11. The etched recess 18 has gaps S which are not covered with the passivation layer 20. Because of the gaps S, the passivation layer 20 is not fully effective for surface protection.

SUMMARY OF THE INVENTION

It is therefore an object of the present invention to provide a heterostructure semiconductor device which will solve the problem of surface states by forming a passivation layer on the surface of a channel region and which can be fabricated with a desired level of reproducibility.

Another object of the present invention is to provide a method of fabricating such a heterostructure semiconductor device.

According to the present invention, there is provided a heterostructure semiconductor device comprising a substrate, an n-type GaAs layer disposed as a channel region in the substrate, a gate electrode disposed on the n-type GaAs layer in direct contact therewith, source and drain electrodes disposed on the n-type GaAs layer, and a GaInP layer disposed as a passivation layer on the n-type GaAs layer in lattice alignment therewith between the gate electrode and the source and drain electrodes.

According to the present invention, there is also provided a method of fabricating a heterostructure semiconductor device, comprising the steps of providing a GaAS substrate including an n-type GaAs layer as a channel region, depositing a GaInP layer on the n-type GaAs layer in lattice alignment therewith, patterning the GaInP layer to define an opening therein with an etchant which is selectively inactive with respect to the n-type GaAs layer, and placing a gate electrode on a surface of the n-type GaAs layer which is exposed in the opening.

The GaInP layer which is formed in lattice alignment with the GaAs layer is used, rather than an undoped GaAs layer, as a passivation layer. The GaInP layer is effective in reducing surface states in the GaAs layer. The GaInP layer, if it has the same thickness as the undoped GaAs layer, has a greater band gap than the undoped GaAs layer, and hence can reduce the thickness of a natural depletion layer. If the GaInP layer is to have the same passivation effect as the undoped GaAs layer, then the GaInP layer may be of smaller thickness and may be processed to desired shape with greater ease. The GaAs layer and the GaInP layer can be etched by different etchant, and hence the GaInP layer can selectively be etched. For example, the GaInP layer is dissolved by, but the GaAs layer is not dissolved by an etchant of hydrochloric acid. Therefore, when the GaInP layer is etched by an etchant of hydrochloric acid, the etching stops reliably and easily at the time the surface of the GaAs layer is exposed.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIGS. 10 through 14 are cross-sectional views showing successive stages of a process of fabricating the heterostructure semiconductor device according to the third embodiment;

FIG. 16 is a cross-sectional view of a heterostructure semiconductor device according to a fourth embodiment of the present invention;

FIGS. 17 through 23 are cross-sectional views showing successive stages of a process of fabricating the heterostructure semiconductor device according to the fourth embodiment.

DETAILED DESCRIPTION OF THE PREFERRED EMBODIMENTS

Figure 1:
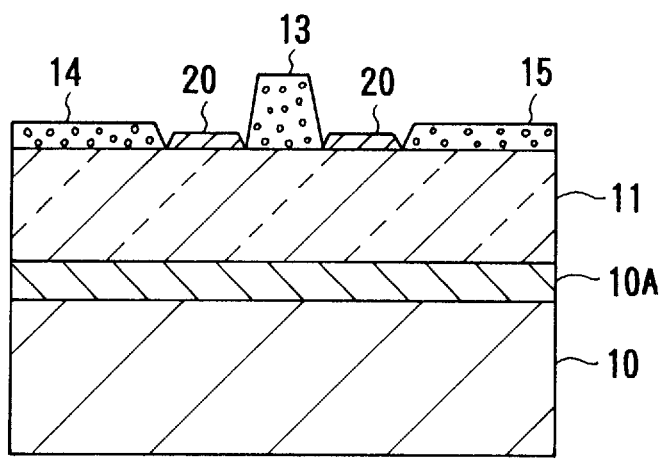
FIG. 1 is a cross-sectional view of a heterostructure semiconductor device according to a first embodiment of the present invention.

Like or corresponding parts are denoted by like or corresponding reference numerals throughout views.

1st Embodiment

Figure 24A:
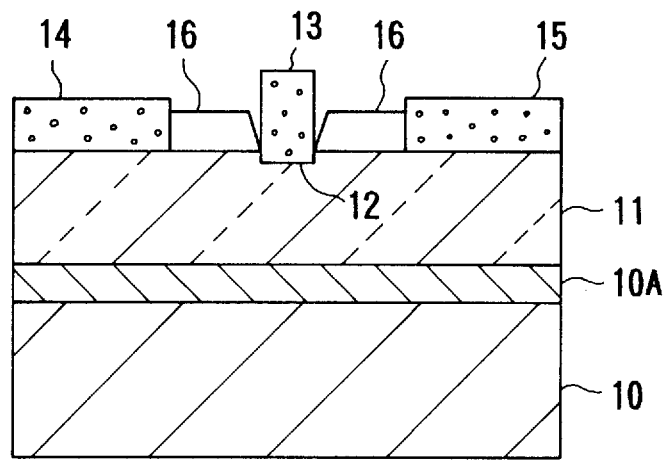
FIGS. 24A and 24B are cross-sectional views of conventional heterostructure semiconductor devices.

FIG. 1 shows a heterostructure semiconductor device according to a first embodiment of the present invention. The heterostructure semiconductor device shown in FIG. 1 comprises a GaAs MESFET which is similar to the conventional GaAs power MESFET shown in FIG. 24A. As shown in FIG. 1, the heterostructure semiconductor device has an n-type GaAs layer 11 serving as a channel region and disposed over a GaAs substrate 10, with an undoped layer 10A as a buffer layer being interposed therebetween. The GaAs MESFET also includes a gate electrode 13 of Ti/Al or the like which is formed in direct contact with the n-type GaAs layer 11, forming a Schottky junction therebetween. A source electrode 14 and a drain electrode 15, which are made of AuGe/Ni/Au or the like, are spaced from each other and disposed on the n-type GaAs layer 11 in direct contact therewith, forming an ohmic contact therebetween.

The GaAs MESFET shown in FIG. 1 differs from the conventional GaAs power MESFET in that it has an undoped GaInP layer 20 serving as a passivation layer for protecting the surface of the n-type GaAs layer 11 and disposed on the n-type GaAs layer 11 in lattice alignment therewith. The undoped GaInP layer 20 is brought into lattice alignment with the n-type GaAs layer 11 if the component ratios of X and Y in $Ga_xIn_yP$ are about 0.5 and about 0.5. Therefore, when GaInP with the above component ratios is grown on the n-type GaAs layer 11 by metal organic chemical vapor deposition (MOCVD) or molecular beam epitaxy (MBE), a lattice-matched crystal layer can continuously be formed on the n-type GaAs layer 11.

Since the undoped GaInP layer 20 is formed in lattice alignment with the n-type GaAs layer 11 and functions as a passivation layer for protecting the surface of the n-type GaAs layer 11, it can reduce surface states formed in the n-type GaAs layer 11. Therefore, the thickness of a natural depletion layer is reduced, preventing the channel from being unduly constricted thereby to improve output characteristics and linear input/output relationship if the GaAs MESFET is used as a power device, or to improve phase noise if the GaAs MESFET is used as an oscillating device.

Successive stages of a process of fabricating the heterostructure semiconductor device according to the first embodiment will be described below with reference to FIGS. 2 through 5.

Figure 2:
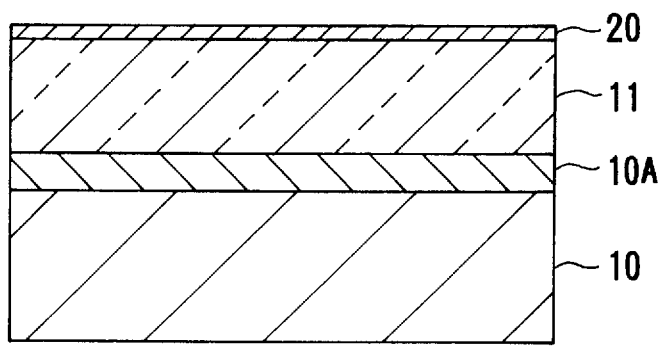
FIGS. 2 through 5 are cross-sectional views showing successive stages of a process of fabricating the heterostructure semiconductor device according to the first embodiment.

FIG. 2 shows a wafer on which to fabricate a GaAs MESFET. As shown in FIG. 2, an undoped GaAs layer 10A for insulating and separating a channel region is deposited to a thickness of about 4000 Å on a GaAs substrate 10. An n-type GaAs layer 11 having an impurity density of about $3 \times 10^{17}$ cm$^{-3}$ and serving as a channel region is deposited to a thickness of about 3000 Å on the undoped GaAs layer 10A. An undoped GaInP layer 20 serving as a passivation layer is deposited to a thickness of about 1000 Å on the n-type GaAs layer 11 in lattice alignment therewith.

Figure 3:
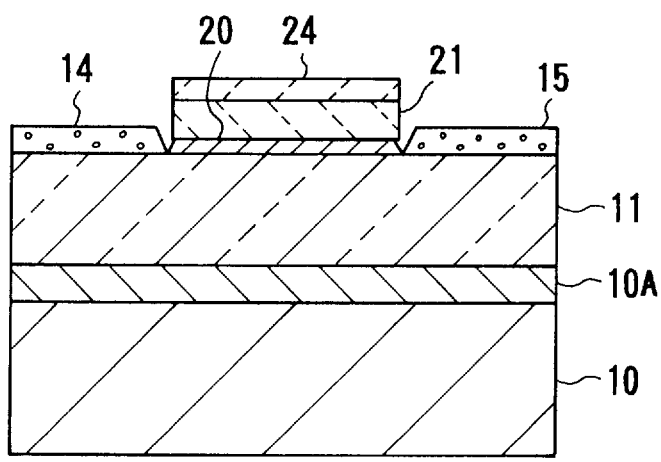

FIG. 3 shows the formation of source and drain electrodes by a lift-off process. First, a photoresist film 21 is coated on the entire surface of the undoped GaInP layer 20 (see FIG. 2). Then, a mask for a pattern of source and drain electrodes is aligned, and the photoresist film 21 is exposed to light and developed, defining openings in the photoresist film 21 at areas where source and drain electrodes are to be formed. Using the photoresist film 21 as a mask, the undoped GaInP layer 20 is selectively etched through the openings by an etchant of hydrochloric acid.

After the undoped GaInP layer 20 is etched, the n-type GaAs layer 11 underneath the undoped GaInP layer 20 is exposed through the openings. However, the n-type GaAs layer 11 is not etched by the etchant of hydrochloric acid. Therefore, even if the etching process continues after the undoped GaInP layer 20 is etched, the surface of the n-type GaAs layer 11 underneath the undoped GaInP layer 20 will not be etched by the etchant. As a result, the etching stops reliably when the surface of the n-type GaAs layer 11 is exposed.

Figure 4:
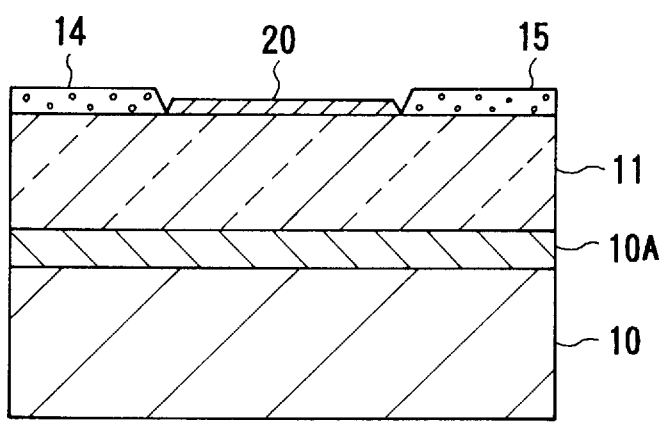

Then, an AuGe/Ni/Au film as an ohmic metal electrode is deposited on the entire surface formed so far by evaporation, as shown in FIG. 3. The AuGe/Ni/Au film is deposited as an AuGe/Ni/Au film 24 on the photoresist film 21, a source electrode 14 on the n-type GaAs layer 11, and a drain electrode 15 on the n-type GaAs layer 11. Thereafter, the photoresist film 21 and the AuGe/Ni/Au film 24 thereon are lifted off. The source electrode 14 and the drain electrode 15 are formed on the completely exposed surface of the n-type GaAs layer 11. When the source electrode 14 and the drain electrode 15 are alloyed by being heated at a temperature ranging from 350° C. to 400° C., they form a reliable ohmic contact with the n-type GaAs layer 11, as shown in FIG. 4.

The formation of a gate electrode will be described below with reference to FIG. 5. First, a photoresist film 22 is coated on the entire surface formed so far. Then, an opening is defined by photolithography in the photoresist film 22 in an area where a gate electrode will be formed. Specifically, using a mask for a gate electrode pattern, the photoresist film 22 is exposed to light and developed for thereby forming the opening therein. Then, the GaInP layer 20 is etched through the opening by an etchant of hydrochloric acid. After the GaInP layer 20 is etched, the surface of the n-type GaAs layer 11 is exposed. Since the n-type GaAs layer 11 is not etched by the etchant of hydrochloric acid, the GaInP layer 20 can be fully etched in a sufficient period of time to completely expose the surface of the n-type GaAs layer 11 through the opening.

Figure 5:
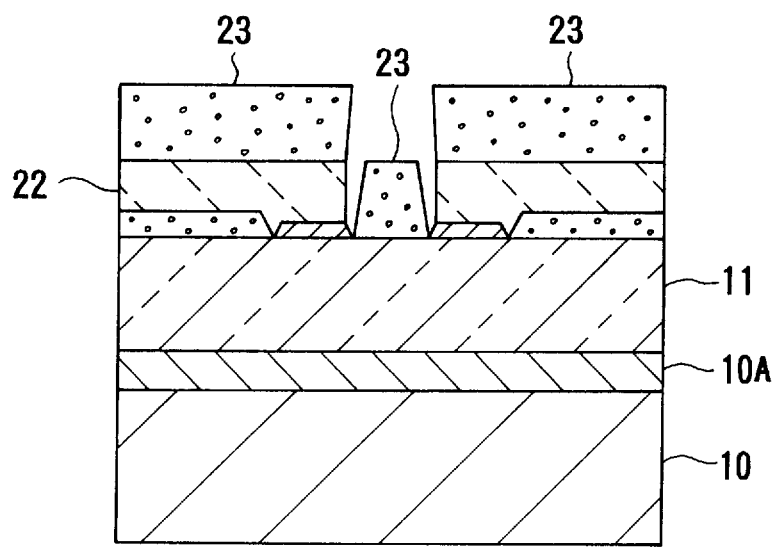

Then, a Ti/Al film 23, for example, which will form a Schottky junction with the n-type GaAs layer 11 is deposited by evaporation on the entire surface formed so far, as shown in FIG. 5. Then, the photoresist film 22 and the Ti/Al film 23 thereon are lifted off, and the remaining Ti/Al film 23 formed in contact with the n-type GaAs layer 11 serves as the gate electrode 13 shown in FIG. 1. In this manner, the GaAs device with the GaInP layer 20 as a passivation layer shown in FIG. 1 is completed.

When the passivation layer is etched, it can selectively be etched without etching the n-type GaAs layer 11. The passivation layer is prevented from being overetched or underetched, but its etching can stop reliably and easily at the time when the surface of the n-type GaAs layer 11 is fully exposed.

The GaAs device thus fabricated is free of the problems of the conventional GaAs device, i.e., the difficulty in controlling the end of the etching process for the passivation layer and the GaAs layer as the channel region, variations in the source-to-drain current $I_{DDS}$ due to overetching, a reduction in the source-to-drain conductance gm due to underetching, and an ohmic contact failure. The GaAs device thus fabricated has stable properties and can be fabricated with a high yield. The GaAs device can easily be manufactured because the etching process has no critical conditions to meet.

The GaInP layer formed in lattice alignment with the GaAs layer can perform the function of a passivation layer more effectively as the GaInP layer has a wider band gap than the GaAs layer, and hence is effective to increase the breakdown voltage and reducing any leakage current. For this reason, the passivation layer itself may be reduced in thickness, and can well be processed to desired shape. Since the output electric power of the GaAs device per unit gate width is larger, the total gate width may be smaller, resulting in a smaller chip size.

In the above embodiment, the source and drain electrodes are formed in direct contact with the n-type GaAs layer. However, an n⁺-type GaAs layer may be formed on the n-type GaAs layer, and the source and drain electrodes may be formed in direct contact with the n⁺-type GaAs layer.

2nd Embodiment

Figure 6:
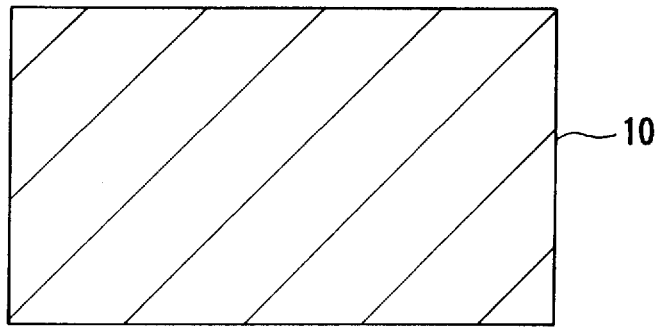
FIGS. 6 through 8 are cross-sectional views showing successive stages of a process of fabricating a heterostructure semiconductor device according to a second embodiment of the present invention.
Figure 7:
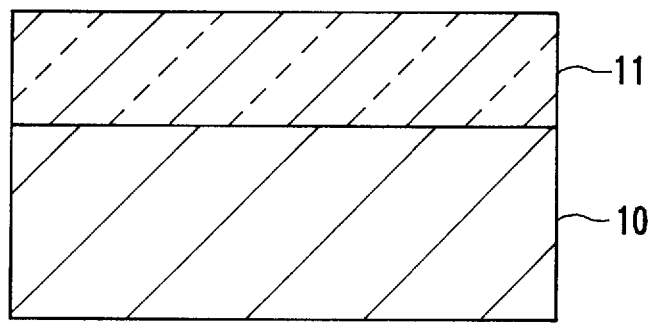
Figure 8:
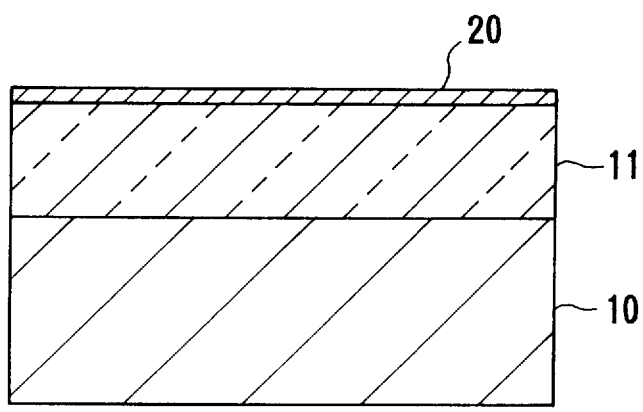

FIGS. 6 through 8 show successive stages of a process of fabricating a heterostructure semiconductor device according to a second embodiment of the present invention.

FIG. 6 illustrates a substrate on which to fabricate a GaAs MESFET. As shown in FIG. 6, the substrate comprises a semi-insulating GaAs substrate 10 which is available at a cost that is a fraction of the cost of the epitaxially grown wafer shown in FIG. 1. Since the proportion of the cost of the wafer material in the entire wafer process cost for GaAs devices is larger than that for silicon devices, use of the GaAs substrate available at a low cost contributes largely to a reduction in the cost of GaAs device chips.

FIG. 7 shows a process stage in which an n-type GaAs layer 11 formed by ion implantation in the semi-insulating GaAs substrate 10. Specifically, a dose amount of $3 \times 10^{12}$ cm$^{-2}$ of Si⁺ ions is introduced into the semi-insulating GaAs substrate 10 at an acceleration voltage of about 100 keV by way of ion implantation. Thereafter, the assembly is annealed to form an n-type impurity layer 11 which serves as a channel region having a surface concentration of about $3 \times 10^{17}$ cm$^{-3}$.

FIG. 8 shows a process stage in which a GaInP layer 20 serving as a passivation layer is epitaxially grown on the n-type GaAs layer 11. The GaInP layer 20 is deposited by MOCVD or MBE. The GaInP layer 20 can selectively be etched without etching the GaAs layer 11 lying underneath the GaInP layer 20. Specifically, only the GaInP layer 20 can be etched by an etchant of hydrochloric acid, and the etching of the GaInP layer 20 stops when the surface of the GaAs layer 11 is exposed.

Subsequent stages of the process are exactly the same as those of the process shown in FIGS. 3 through 5. In this manner, a GaAs device having the same structure as the GaAs device shown in FIG. 1 can be fabricated.

3rd Embodiment

Figure 9:
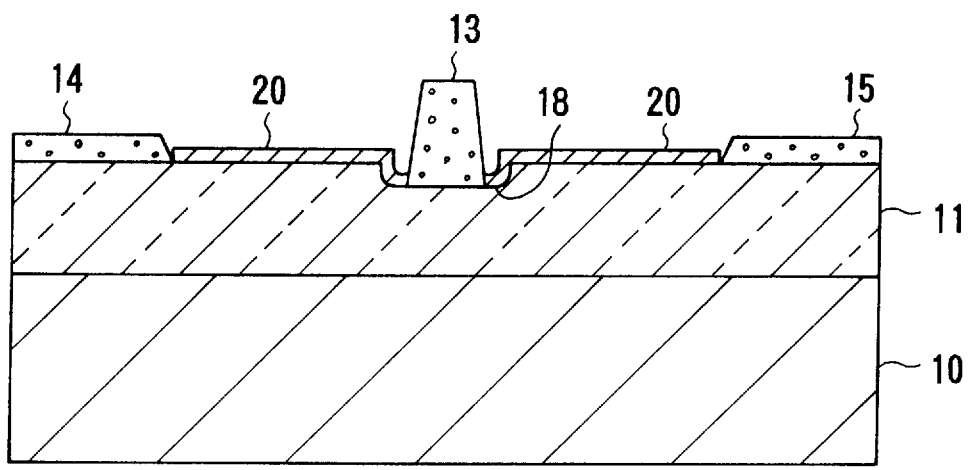
FIG. 9 is a cross-sectional view of a heterostructure semiconductor device according to a third embodiment of the present invention.

FIG. 9 shows a GaAs device as a heterostructure semiconductor device according to a third embodiment of the present invention. In the GaAs device shown in FIG. 9, the surface of an n-type GaAs layer 11 serving as a channel region between a gate electrode 13 and source and drain electrodes 14, 15 and including an etched recess 18 is fully covered with a GaInP layer 20 as a passivation layer. The passivation layer is thus more effective than the passivation layer 20 in the conventional heterostructure semiconductor device shown in FIG. 24B in which the etched recess 18 has gaps S which are not covered with the passivation layer 20.

Figure 24B:
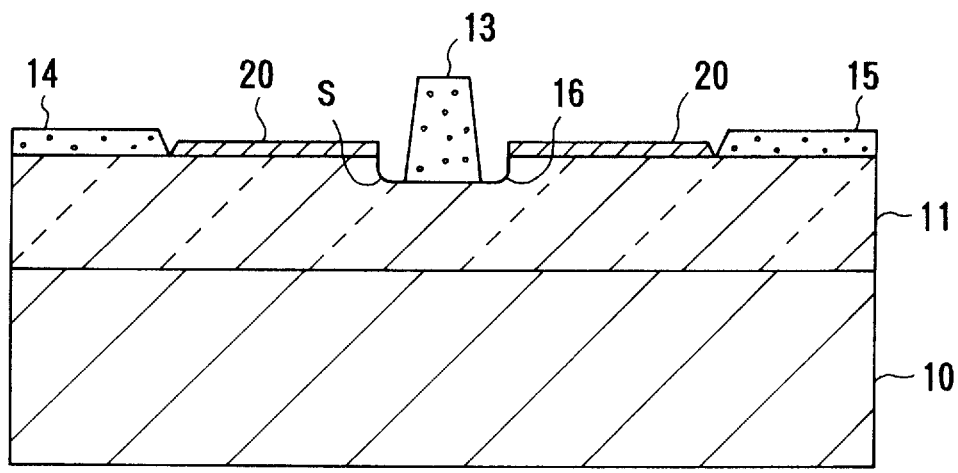

Other structural details of the GaAs device are the same as those of the conventional heterostructure semiconductor device shown in FIG. 24B. The gate electrode 13, which is made of Ti/Al or the like, is formed in direct contact with the n-type GaAs layer 11 in the recess 18, forming a Schottky junction therebetween. The source and drain electrodes 14, 15, which are made of AuGe/Ni/Au or the like, are formed in direct contact with the n-type GaAs layer 11, forming an ohmic contact therewith.

The GaAs device has an undoped GaInP layer 20 serving as a passivation layer for protecting the n-type GaAs layer 11 and disposed on the n-type GaAs layer 11 in lattice alignment therewith. The undoped GaInP layer 20 is brought into lattice alignment with the n-type GaAs layer 11 if the component ratios of X and Y in $Ga_xIn_yP$ are about 0.5 and about 0.5. Since the undoped GaInP layer 20 is formed in lattice alignment with the n-type GaAs layer 11 and functions as a passivation layer for protecting the n-type GaAs layer 11, it can reduce surface states formed in the n-type GaAs layer 11. Therefore, the thickness of a natural depletion layer is reduced, preventing the channel from being unduly constricted thereby to improve output characteristics and linear input/output relationship if the GaAs device is used as a power device, or to improve phase noise if the GaAs device is used as an oscillating device.

Successive stages of a process of fabricating the heterostructure semiconductor device according to the third embodiment will be described below with reference to FIGS. 10 through 14.

FIG. 10 shows a substrate on which to fabricate a GaAs MESFET. As shown in FIG. 10, the substrate comprises a semi-insulating GaAs substrate 10, and an n-type GaAs layer 11 serving as a channel region is deposited on the semi-insulating GaAs substrate 10 by way of epitaxial growth with a buffer layer interposed therebetween.

FIG. 11 shows a process stage in which the n-type GaAs layer 11 is etched to define a recess 18 in its surface. Specifically, using a photoresist film as a mask, the n-type GaAs layer 11 is etched in a dry or wet etching process to achieve desired values for the source-to-drain current IDDS and conductance gm.

FIG. 12 shows a process stage in which a GaInP layer 20 is epitaxially grown as a passivation layer on the n-type GaAs layer 11. The GaInP layer 20 is deposited by MOCVD or MBE. The GaInP layer 20 can selectively be etched without etching the GaAs layer 11 lying underneath the GaInP layer 20. Specifically, only the GaInP layer 20 can be etched by an etchant of hydrochloric acid, and the etching of the GaInP layer 20 stops when the surface of the GaAs layer 11 is exposed.

FIG. 13 shows a process stage in which source and drain electrodes are formed by a lift-off process. First, a photoresist film is coated on the entire surface of the undoped GaInP layer 20 (see FIG. 12). Then, a mask for a pattern of source and drain electrodes is aligned, and the photoresist film is exposed to light and developed, defining openings in the photoresist film at areas where source and drain electrodes are to be formed. Using the photoresist film as a mask, the GaInP layer 20 is selectively etched through the openings by an etchant of hydrochloric acid.

Then, an AuGe/Ni/Au film as an ohmic metal electrode is deposited on the entire surface formed so far by evaporation. The AuGe/Ni/Au film is deposited as an AuGe/Ni/Au film on the photoresist film, a source electrode 14 on the n-type GaAs layer 11, and a drain electrode 15 on the n-type GaAs layer 11. Thereafter, the photoresist film and the AuGe/Ni/Au film thereon are lifted off. The source electrode 14 and the drain electrode 15 are formed on the completely exposed surface of the n-type GaAs layer 11. When the source electrode 14 and the drain electrode 15 are alloyed, they form a reliable ohmic contact with the n-type GaAs layer 11, as shown in FIG. 13.

The formation of a gate electrode will be described below with reference to FIG. 14. First, a photoresist film 22 is coated on the entire surface formed so far. Then, an opening is defined by photolithography in the photoresist film 22 in an area where a gate electrode will be formed. Then, the GaInP layer 20 is etched through the opening by an etchant of hydrochloric acid. After the GaInP layer 20 is etched, the surface of the n-type GaAs layer 11 is exposed. Since the n-type GaAs layer 11 is not etched by the etchant of hydrochloric acid, the GaInP layer 20 can be fully etched in a sufficient period of time to completely expose the surface of the n-type GaAs layer 11 through the opening.

Then, a Ti/Al film 23, for example, which will form a Schottky junction with the n-type GaAs layer 11 is deposited by evaporation on the entire surface formed so far, as shown in FIG. 14. Then, the photoresist film 22 and the Ti/Al film 23 thereon are lifted off, and the remaining Ti/Al film 23 formed in contact with the n-type GaAs layer 11 serves as the gate electrode 13 shown in FIG. 9. In this manner, the GaAs device with the GaInP layer 20 as a passivation layer without any gaps in the recess 18 shown in FIG. 9 is completed.

Figure 15:
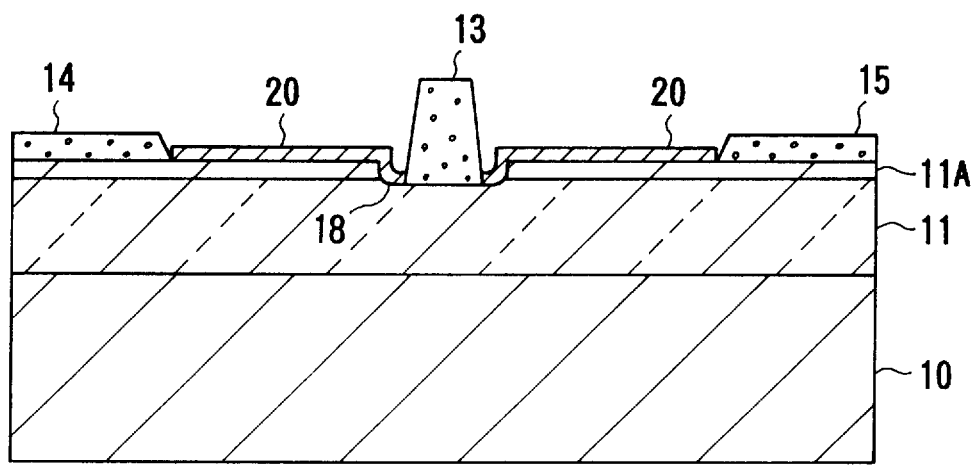
FIG. 15 is a cross-sectional view of a modified heterostructure semiconductor device according to the present invention.

FIG. 15 shows a modified GaAs MESFET according to the present invention. The GaAs device shown in FIG. 15 differs from the GaAs device shown in FIG. 9 in that an $n^+$-type GaAs layer 11A is disposed on the n-type GaAs layer 11, and only a portion of the $n^+$-type GaAs layer 11A is removed from the recess 18 when the recess 18 is etched. The $n^+$-type GaAs layer 11A serves to reduce the resistance between the source and drain electrodes 14, 15 and improves the ohmic contact of the source and drain electrodes 14, 15 with the n-type GaAs layer 11. The GaAs device shown in FIG. 15 can be fabricated in the same manner as the process shown in FIGS. 10 through 14 except that a substrate which includes the $n^+$-type GaAs layer 11A epitaxially grown on the n-type GaAs layer 11 is used.

In the above embodiments, an undoped GaInP layer is used as a passivation layer. However, an undoped GaAs layer may be used as a passivation layer. Use of an undoped GaAs layer as a passivation layer is widely practiced in the art. The undoped GaAs layer is as effective as the GaInP layer to reduce surface states, reduce the thickness of a natural depletion layer, and reduce phase noise if the GaAs device is used as an oscillating device.

In the embodiments shown in FIGS. 9 through 15, the passivation layer for protecting the surface of the heterostructure semiconductor device is formed without any gaps between the gate electrode and the source and drain electrodes. This structure is effective in further reducing surface states in the heterostructure semiconductor device. The heterostructure semiconductor device, if used as an oscillating device, can reduce phase noise, and if used as a high-output device, can prevent the channel from being constricted and improve output characteristics.

4th Embodiment

FIG. 16 shows a GaAs device as a heterostructure semiconductor device according to a fourth embodiment of the present invention. In the GaAs device shown in FIG. 16, unlike the conventional heterostructure semiconductor device shown in FIG. 24B, an etched recess 18 in which a gate electrode 13 is disposed is fully filled with a GaInP layer 21 as an embedded passivation layer. Since the gate electrode 13 is disposed in the embedded passivation layer, the surfaces of an n-type GaAs layer 11 and an $n^+$-type GaAs layer 11A which are positioned in the recess 18 are covered with the passivation layer 21 without any gaps. The passivation layer 21 is thus more effective than the passivation layer 16 in the conventional heterostructure semiconductor device shown in FIG. 24B in which the etched recess 18 has gaps S which are not covered with the passivation layer 16.

The gate electrode 13 is self-aligned with the recess 18. Specifically, the recess 18 is etched through an opening 17H in an oxide or nitride film 17. The gate electrode 13 is deposited by evaporation also through the opening 17H. Accordingly, the gate electrode 13 is positioned by self alignment at the center of the recess 18.

The gate electrode 13 has a very small width which ranges from about 0.3 to 0.8 μm for a frequency band of 12 GHz and from about 0.8 to 1.5 μm for a frequency band from 1 to 2 GHz. Therefore, the accuracy with which the gate electrode 13 is positioned in the recess 18 greatly affects a yield of heterostructure semiconductor devices. With an ordinary optical mask registration device which does not use a stepper, a mask misalignment will cause a reduction in a yield of heterostructure semiconductor devices. According to the fourth embodiment, a yield of heterostructure semiconductor devices is greatly increased because the gate electrode 13 is self-aligned with the recess 18.

Other structural details of the heterostructure semiconductor device according to the fourth embodiment are the same as those of the conventional heterostructure semiconductor devices. The gate electrode 13, which is made of Ti/Al or the like, is formed in direct contact with the n-type GaAs layer 11 in the recess 18, forming a Schottky junction therebetween. The source and drain electrodes 14, 15, which are made of AuGe/Ni/Au or the like, are formed in direct contact with the n-type GaAs layer 11, forming an ohmic contact therewith.

The undoped GaInP layers 20, 21 serving as a passivation layer for protecting the n$^+$-type GaAs layer 11A are disposed on the n-type GaAs layer 11 in lattice alignment therewith. The undoped GaInP layers 20, 21 are brought into lattice alignment with the n-type GaAs layer 11 and the n$^+$-type GaAs layer 11A if the component ratios of X and Y in Ga$_X$In$_Y$P are about 0.5 and about 0.5. Since the undoped GaInP layers 20, 21 are formed in lattice alignment with the n-type GaAs layer 11 and functions as a passivation layer for protecting the n-type GaAs layer 11, it can reduce surface states formed in the n-type GaAs layer 11. Therefore, the thickness of a natural depletion layer is reduced, preventing the channel from being unduly constricted thereby to improve output characteristics and linear input/output relationship if the GaAs device is used as a power device, or to improve phase noise if the GaAs device is used as an oscillating device.

Successive stages of a process of fabricating the heterostructure semiconductor device according to the fourth embodiment will be described below with reference to FIGS. 17 through 23.

Figure 17:
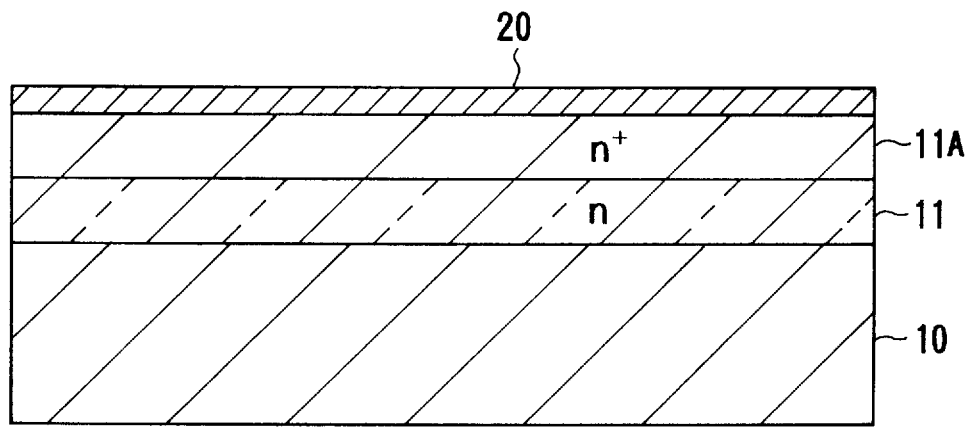

FIG. 17 shows a substrate on which to fabricate a GaAs MESFET. As shown in FIG. 17, the substrate comprises a semi-insulating GaAs substrate 10, and an n-type GaAs layer 11 serving as a channel region is deposited on the semi-insulating GaAs substrate 10 by way of epitaxial growth. An n$^+$-type GaAs layer 11A, which has a high impurity concentration, is deposited on the n-type GaAs layer 11 by epitaxial growth. A GaInP layer 20, which serves as a passivation layer, is deposited on the n$^+$-type GaAs layer 11A in lattice alignment therewith by epitaxial growth.

Figure 18:
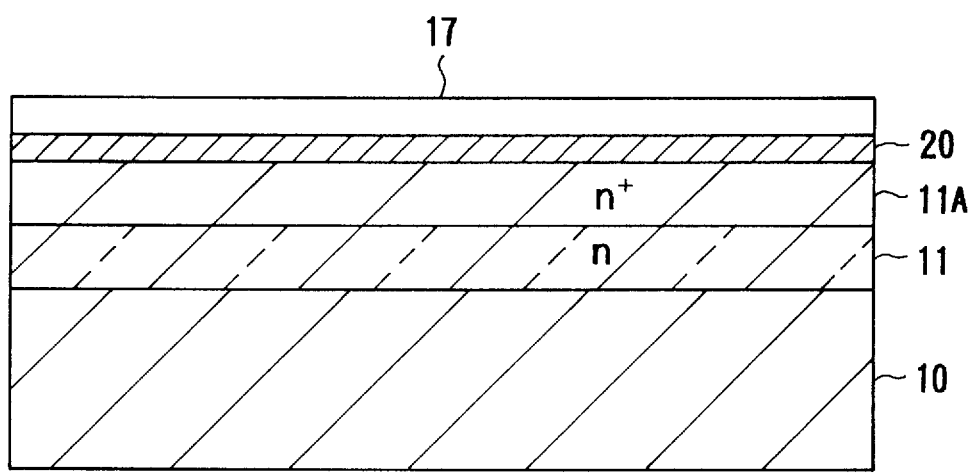

FIG. 18 shows a process stage in which an oxide or nitride film 17 is deposited on the GaInP layer 20 by vapor phase growth. Specifically, a photoresist film is coated on the entire surface of the oxide or nitride film 17. After the photoresist film is exposed to light and developed to define an opening therein. Then, using the photoresist as a mask, an opening 17H is defined in the oxide or nitride film 17. The GaInP layer 20 is etched by an etchant of hydrochloric acid. Thereafter, the n$^+$-type GaAs layer 11A and the n-type GaAs layer 11 are etched to define a recess 18 therein through the opening 17H in the oxide or nitride film 17 and the opening in the GaInP layer 20, as shown in FIG. 19.

FIG. 19 shows a process stage in which the recess 18 has been defined. The n$^+$-type GaAs layer 11A and the n-type GaAs layer 11 are in a dry or wet etching process to achieve desired values for the source-to-drain current I$_{DDS}$ and conductance gm.

FIG. 20 shows a process stage in which a GaInP layer 21 serving as a passivation layer is selectively epitaxially grown to fill the recess 18. The GaInP layer 21 is deposited by MOCVD or MBE. The GaInP layer 21, which is formed in lattice alignment with the GaAs layer 11, is not deposited on the oxide or nitride film 17, but is grown only on an exposed surface of the GaAs layer 11 which has been etched to form the recess 18. Therefore, the recess 18 is filled up with the GaInP layer 21.

Figure 21:
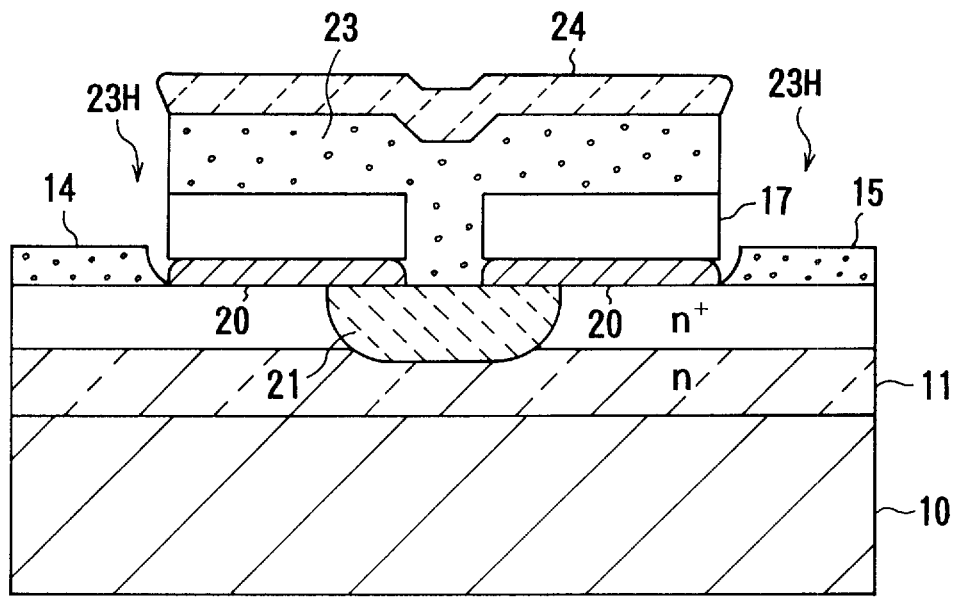

FIG. 21 shows the formation of source and drain electrodes by a lift-off process. First, a photoresist film 23 is coated on the entire surface of the oxide or nitride film 17 (see FIG. 20). Then, a mask for a pattern of source and drain electrodes is aligned, and the photoresist film 23 is exposed to light and developed, defining openings 23H in the photoresist film 23 at areas where source and drain electrodes are to be formed. Using the photoresist film 23 as a mask, the undoped GaInP layer 20 is selectively etched through the openings 23H by an etchant of hydrochloric acid.

Then, an AuGe/Ni/Au film as an ohmic metal electrode is deposited on the entire surface formed so far by evaporation. The AuGe/Ni/Au film is deposited as an AuGe/Ni/Au film 24 on the photoresist film 23, a source electrode 14 on the n$^+$-type GaAs layer 11A, and a drain electrode 15 on the n$^+$-type GaAs layer 11A. Thereafter, the photoresist film 23 and the AuGe/Ni/Au film 24 thereon are lifted off. The source electrode 14 and the drain electrode 15 are formed on the completely exposed surface of the n$^+$-type GaAs layer 11A. When the source electrode 14 and the drain electrode 15 are alloyed, they form a reliable ohmic contact with the n$^+$-type GaAs layer, 11A formed on the n-type GaAs layer 11 which serves as a channel region.

Figure 22:
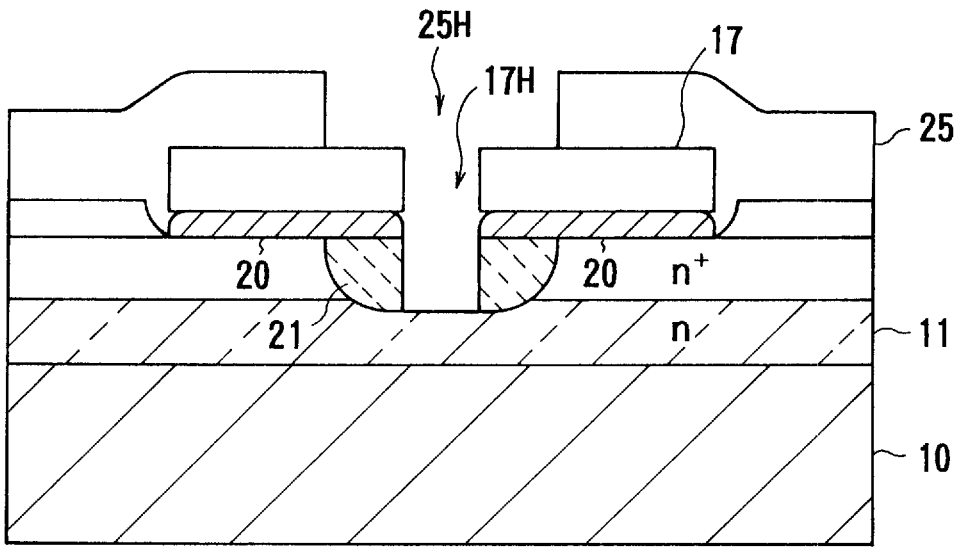

The formation of a gate electrode will be described below with reference to FIGS. 22 and 23. First, a photoresist film 25 is coated on the entire surface formed so far. Then, an opening 25H is defined in the photoresist film 25 in an area where a gate electrode will be formed, by successive steps of mask alignment, exposure to light, and development. Since the opening 25H does not require high dimensional accuracy, it may have roughly defined dimensions. Then, the GaInP layer 21 serving as an embedded passivation layer is anisotropically etched by an RIE (reactive ion etching) process through the opening 25H and the opening 17H. After the GaInP layer 21 is etched, the surface of the n-type GaAs layer 11 is exposed, as shown in FIG. 22.

Figure 23:
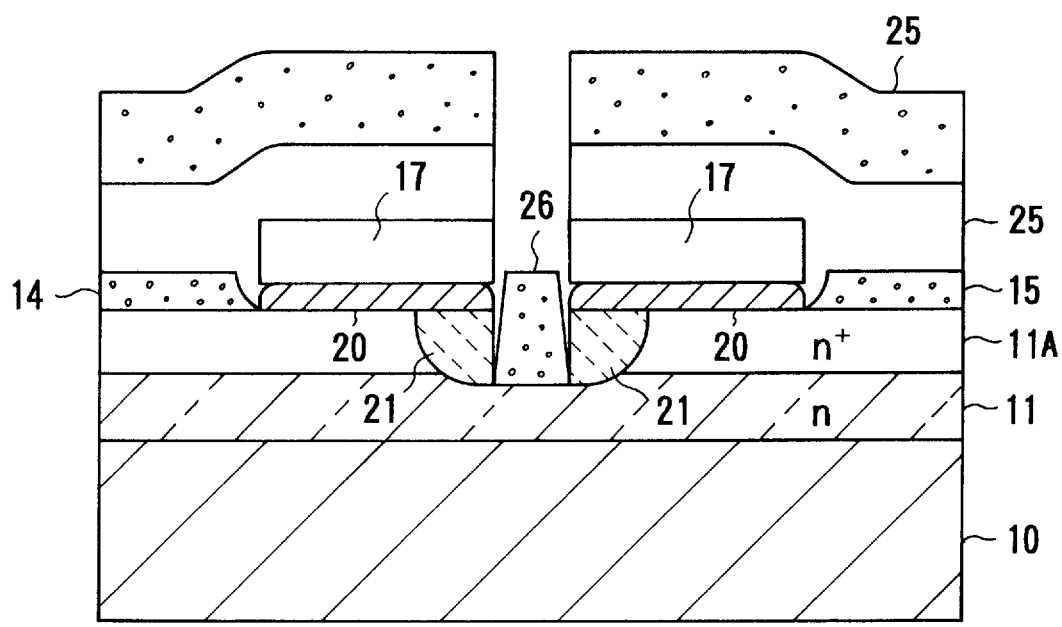

Then, a Ti/Al film 26, for example, which will form a Schottky junction with the n-type GaAs layer 11 is deposited by evaporation on the entire surface formed so far, as shown in FIG. 23. Then, the photoresist film 25 and the Ti/Al film 26 thereon are lifted off, and the remaining Ti/Al film 26 formed in contact with the n-type GaAs layer 11 serves as the gate electrode 13 shown in FIG. 16. In this fashion, the GaAs device in which the GaInP layer 21 as an embedded passivation layer shown in FIG. 16 is filled in the recess 18 without any gaps is completed.

In the above embodiment, an undoped GaInP layer is used as a passivation layer. However, an undoped GaAs layer may be used as a passivation layer. Use of an undoped GaAs layer as a passivation layer is widely practiced in the art. The undoped GaAs layer is as effective as the GaInP layer to reduce surface states, reduce the thickness of a natural depletion layer, and reduce phase noise if the GaAs device is used as an oscillating device.

In the fifth embodiment shown in FIGS. 16 through 23, the passivation layer for protecting the surface of the heterostructure semiconductor device is formed without any gaps between the gate electrode and the source and drain electrodes, and the gate electrode is self-aligned with the etched recess. This structure is effective in further reducing surface states in the heterostructure semiconductor device. The gate electrode can thus be positioned with respect to the recess without using a high-precision mask alignment device such as a stepper. The heterostructure semiconductor device, if used as an oscillating device, can reduce phase noise, and if used as a high-output device, can prevent the channel from being constricted and improve output characteristics. The heterostructure semiconductor device can be manufactured with a good yield.

Although certain preferred embodiments of the present invention have been shown and described in detail, it should be understood that various changes and modifications may be made therein without departing from the scope of the appended claims.

What is claimed is:

1. A heterostructure semiconductor device comprising:

a substrate;

an n-type GaAs layer disposed as a channel region in said substrate;

a gate electrode disposed on said n-type GaAs layer in direct contact therewith;

source and drain electrodes disposed on said n-type GaAs layer; and a GaInP layer disposed as a passivation layer on said n-type GaAs layer in lattice alignment therewith between said gate electrode and said source and drain electrodes.

2. A heterostructure semiconductor device according to claim 1, wherein said GaInP layer is deposited on said n-type GaAs layer by epitaxial growth.

3. A heterostructure semiconductor device according to claim 1, wherein said n-type GaAs layer is formed by introducing an impurity into said substrate by way of ion implantation.

4. A heterostructure semiconductor device according to claim 1, wherein said n-type GaAs layer has a recess etched in a surface thereof, said gate electrode is formed in direct contact with a surface of said n-type GaAs layer in said recess.

* * * * *